(12) United States Patent
Shinohara

(10) Patent No.: US 7,218,347 B2
(45) Date of Patent: May 15, 2007

(54) PHOTOELECTRIC CONVERSION ELEMENT AND SOLID-STATE IMAGE SENSING DEVICE USING THE SAME

(75) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 746 days.

(21) Appl. No.: 10/407,723

(22) Filed: Apr. 4, 2003

(65) Prior Publication Data

US 2003/0189656 A1    Oct. 9, 2003

(30) Foreign Application Priority Data

Apr. 5, 2002    (JP) ............................. 2002-104029

(51) Int. Cl.
*H04N 3/14* (2006.01)
*H04N 5/335* (2006.01)
*H04N 9/04* (2006.01)
*H04N 9/083* (2006.01)

(52) U.S. Cl. ...................................................... 348/272

(58) Field of Classification Search ................ 348/272, 348/273; 257/292; 438/107, 353
See application file for complete search history.

(56) References Cited

U.S. PATENT DOCUMENTS

| | | | |
|---|---|---|---|
| 4,613,895 A | 9/1986 | Burkey et al. | |
| 5,453,611 A * | 9/1995 | Oozu et al. | 250/208.1 |
| 5,920,092 A * | 7/1999 | Watanabe | 257/292 |
| 5,965,875 A | 10/1999 | Merrill | |
| 6,727,521 B2 * | 4/2004 | Merrill | 257/98 |
| 2002/0045306 A1* | 4/2002 | Watanabe | 438/224 |

* cited by examiner

*Primary Examiner*—David Ometz
*Assistant Examiner*—Tuan Le
(74) *Attorney, Agent, or Firm*—Morgan & Finnegan, LLP

(57) ABSTRACT

Upon reading out signals from a plurality of photodiode layers, highly color-separable signals which suffer less color mixture and noise are read out. A photoelectric conversion element which is formed by alternately stacking photoelectric conversion regions of a first conductivity type and regions of a second conductivity type as a conductivity type opposite to the first conductivity type to form a multi-layered structure, in which the photoelectric conversion regions of the first conductivity type are formed to have depths suited to mainly photoelectrically convert light components in a plurality of different wavelength ranges, and which outputs signals for respective wavelength ranges, has a plurality of charge accumulation portions for accumulating charges obtained by photoelectric conversion in the photoelectric conversion regions in surface regions of the photoelectric conversion regions, and an output portion for converting charges transferred from the charge accumulation portions into electrical signals, and outputting the electrical signals.

13 Claims, 14 Drawing Sheets

FIG. 6

| A | B | A | B |
|---|---|---|---|
| B | A | B | A |
| A | B | A | B |

FIG. 8A

| Cy FILTER | Ye FILTER |
|---|---|
| B/G | G/R |
| Ye FILTER | Cy FILTER |
| G/R | B/G |

FIG. 8B

| G FILTER | Mg FILTER |
|---|---|
| G | B/R |
| Mg FILTER | G FILTER |
| B/R | G |

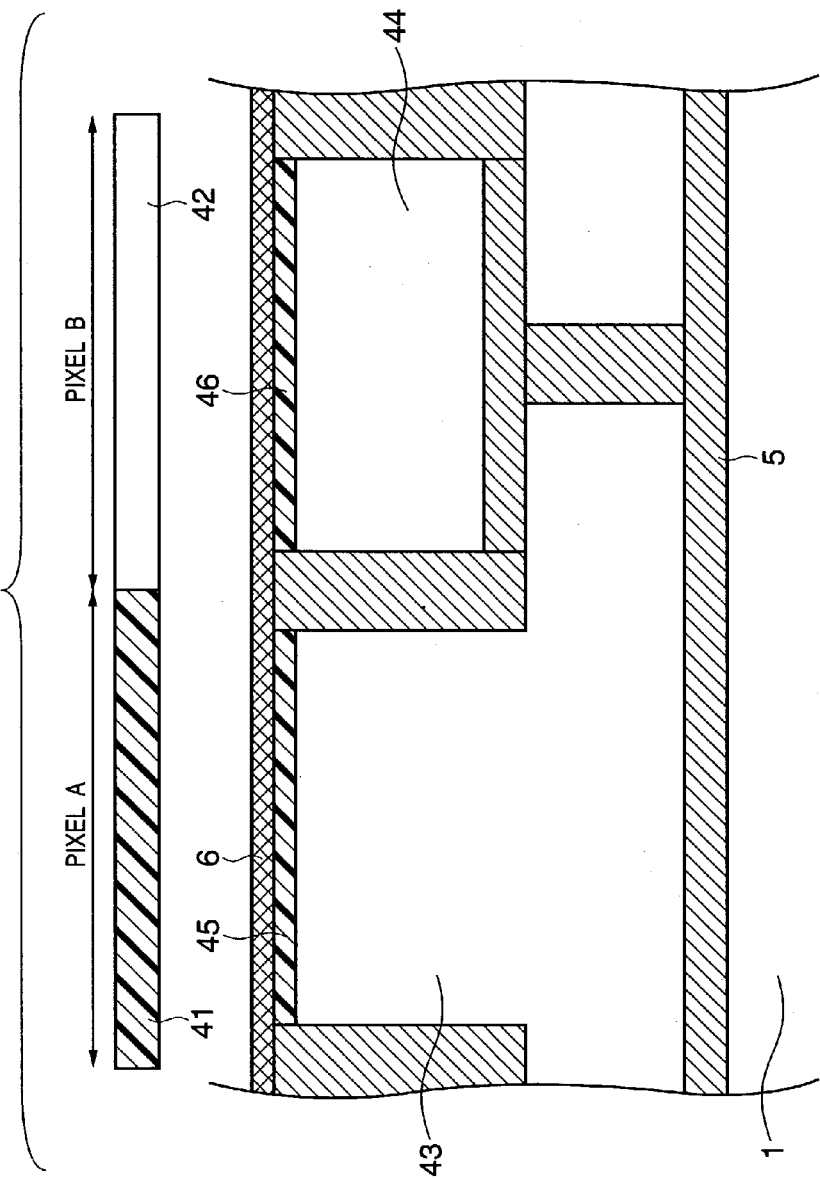

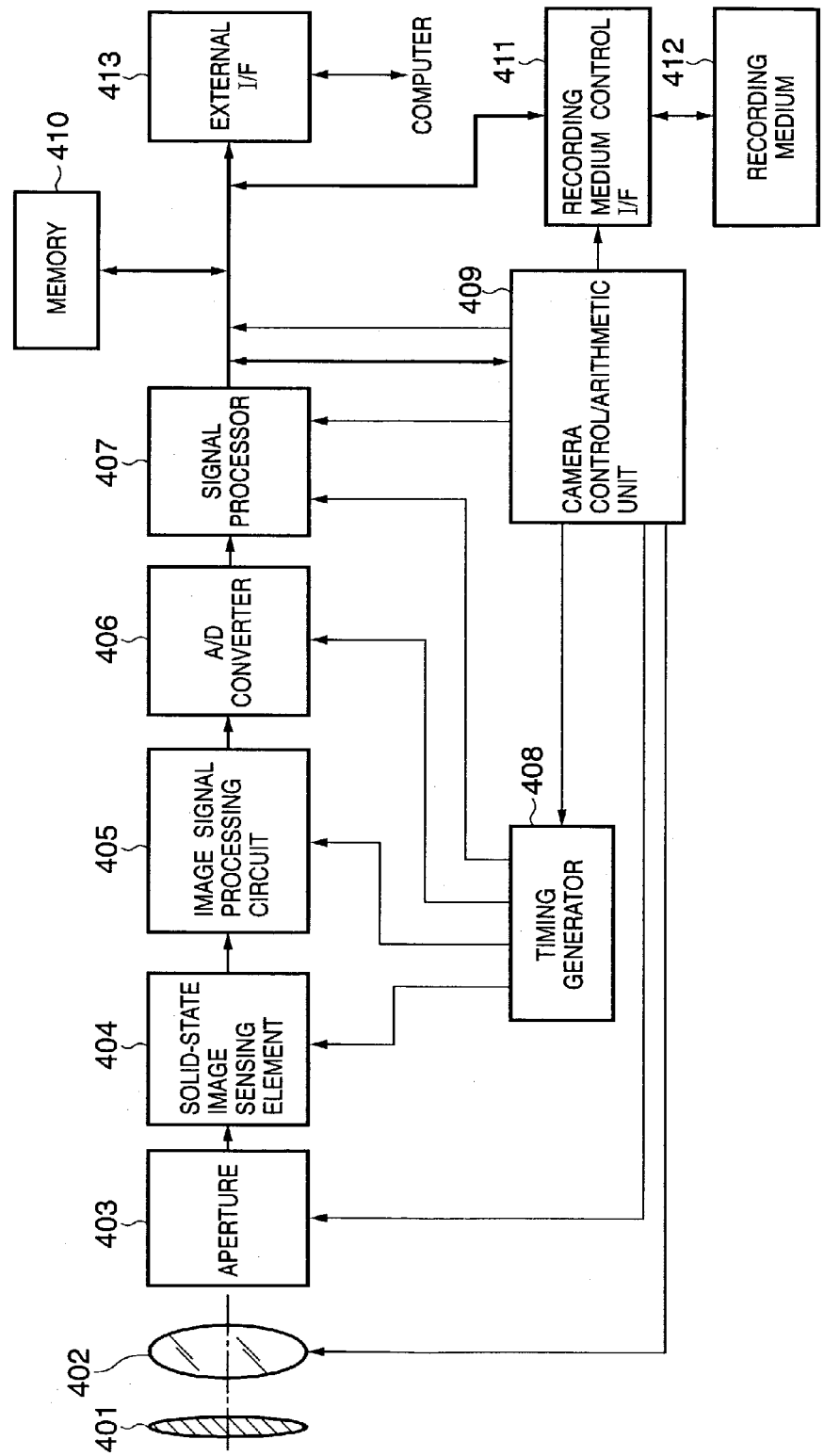

PRIOR ART

PHOTOELECTRIC CONVERSION ELEMENT AND SOLID-STATE IMAGE SENSING DEVICE USING THE SAME

FIELD OF THE INVENTION

The present invention relates to a photoelectric conversion element and an image sensing device using the same and, more particularly, to a photoelectric conversion element used to capture a color image, and a solid-state image sensing device using the same.

BACKGROUND OF THE INVENTION

Conventionally, a general color solid-state image sensing device detects photo signals of specific wavelength ranges obtained via color filters, which are arranged on respective pixels. Hence, only a part of incident light reaches a semiconductor where photoelectric conversion is carried out, and a signal output decreases compared to a signal converted without color filters. A proposal that solves such a signal loss problem has been made by U.S. Pat. No. 4,613,895 "Color Responsive Imaging Device Employing Wavelength Dependent Semiconductor Optical Absorption".

According to this proposal, threefold photoelectric conversion units are layed in a semiconductor in depth, and three kinds of signal charges accumulated in these photoelectric conversion units are independently transferred and read out using triple CCDs which are also formed in the semiconductor in depth.

FIG. 13 shows a representative embodiment of the above proposal. Referring to FIG. 13, reference numeral 51 denotes a semiconductor substrate; 52, an insulating film formed on the interface of the semiconductor substrate 51; and 53, an electrode formed on the insulating film 52. The semiconductor substrate 51 is formed by stacking p-, n-, p-, n-, p-, and n-type regions from the interface to the depth, and reference numerals 54, 55, and 56 denote signal charges which are generated in response to incident light and are accumulated in p-type semiconductor regions. The signal charges 54, 55, and 56 are transferred and read out by CCDs formed in a direction perpendicular to the plane of FIG. 13.

U.S. Pat. No. 5,965,875 "Color separation in an active pixel cell imaging array using a tripe-well structure" has also proposed a photo-detection device having a triple-stage photodiode structure. According to this proposal, terminals of respective photodiodes are formed in the semiconductor interface, and are connected to the gates of MOS transistors which serve as amplifiers, so that signals of the photodiodes are amplified and read out. FIG. 14 shows this invention. Referring to FIG. 14, reference numeral 57 denotes a p-type semiconductor substrate; 58, an n-type semiconductor layer formed to be stacked on the substrate 57; 59, a p-type semiconductor layer formed to be stacked on the layer 58; and 60, an n-type semiconductor layer formed in the semiconductor interface to be stacked on the layer 59. By pairing the substrate 57 and layer 58, the layers 58 and 59, and the layers 59 and 60, three photodiodes are formed. Reference numerals 61, 62, and 63 denote MOS transistors, which are respectively connected to the semiconductor layers 57, 58, and 59, and are used to amplify and read out signal charges accumulated on those semiconductor layers.

The above two proposals exploit the dependence of the light absorption coefficients of semiconductors on the light wavelengths to implement color separation. A photoelectric conversion unit for a shorter wavelength, i.e., blue light, is formed in the top layer, a photoelectric conversion unit for a longer wavelength, i.e., red light, is formed in the bottom layer, and a photoelectric conversion unit for a middle wavelength, i.e., green light, is formed in the middle layer, thus attaining color separation. These structures uses incident light without a loss, and output greater signals compared to a general color filter device. Moreover, since three different color signals can be extracted from a single location from two-dimensional viewpoint, the color resolution can be improved compared to the color filter system that extracts one type of color signal from one pixel.

However, the example of U.S. Pat. No. 4,613,895 uses embedded triple-stage CCDs which are stacked in the depth of a semiconductor, as described above. The structure therefore hardly control the potential wells of the middle and bottom CCDs by a gate electrode located on the surface so as to transfer signal charges.

In U.S. Pat. No. 5,965,875, since the electrodes of the respective photodiodes are commonly used as those of photodiodes neighboring in the depth direction, a signal voltage of one photodiode is influenced by that of another neighboring photodiode, and it is difficult to extract a independent signal of each photodiode. Furthermore, this prior invention offers another problem that considerable kTC noise resulting from the capacitance of the photodiode generates, upon resetting each photodiode

SUMMARY OF THE INVENTION

The present invention has been made in consideration of the aforementioned problems, and has its object to read out color-separated signals which include less color mixture and less noise from plural photodiode layers.

In order to achieve the above object, a photoelectric conversion element according to the present invention is formed by alternately stacking photoelectric conversion regions of a first conductivity type and a second conductivity type as a conductivity type opposite to the first conductivity type, in which each photoelectric conversion region of the first conductivity type is located in the depths suited to mainly photoelectrically convert light components with specific wavelength ranges, outputs, signal for the respective wavelength ranges, has a charge accumulation portion formed in the surface region of the photoelectric conversion region for accumulating charges obtained by photoelectric conversion in the photoelectric conversion region, and has an output portion for converting charges transferred from the charge accumulation portions into electrical signals, and outputting the electrical signals.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 6 shows an example of a layout of pixels according to the second embodiment of the present invention;

FIGS. 8A and 8B show layout examples for four pixels in an area sensor that uses multi-layered photodiode photodiodes according to the third embodiment of the present invention;

FIG. 9 is a sectional view showing a section of a pixel which has a multi-layered photodiode structure according to a fourth embodiment of the present invention;

FIG. 10 is a block diagram showing the arrangement of an image sensing system according to a fifth embodiment of the present invention;

DETAILED DESCRIPTION OF THE PREFERRED EMBODIMENTS

Preferred embodiments of the present invention will now be described in detail with reference to the accompanying drawings.

<First Embodiment>

Figure 1:
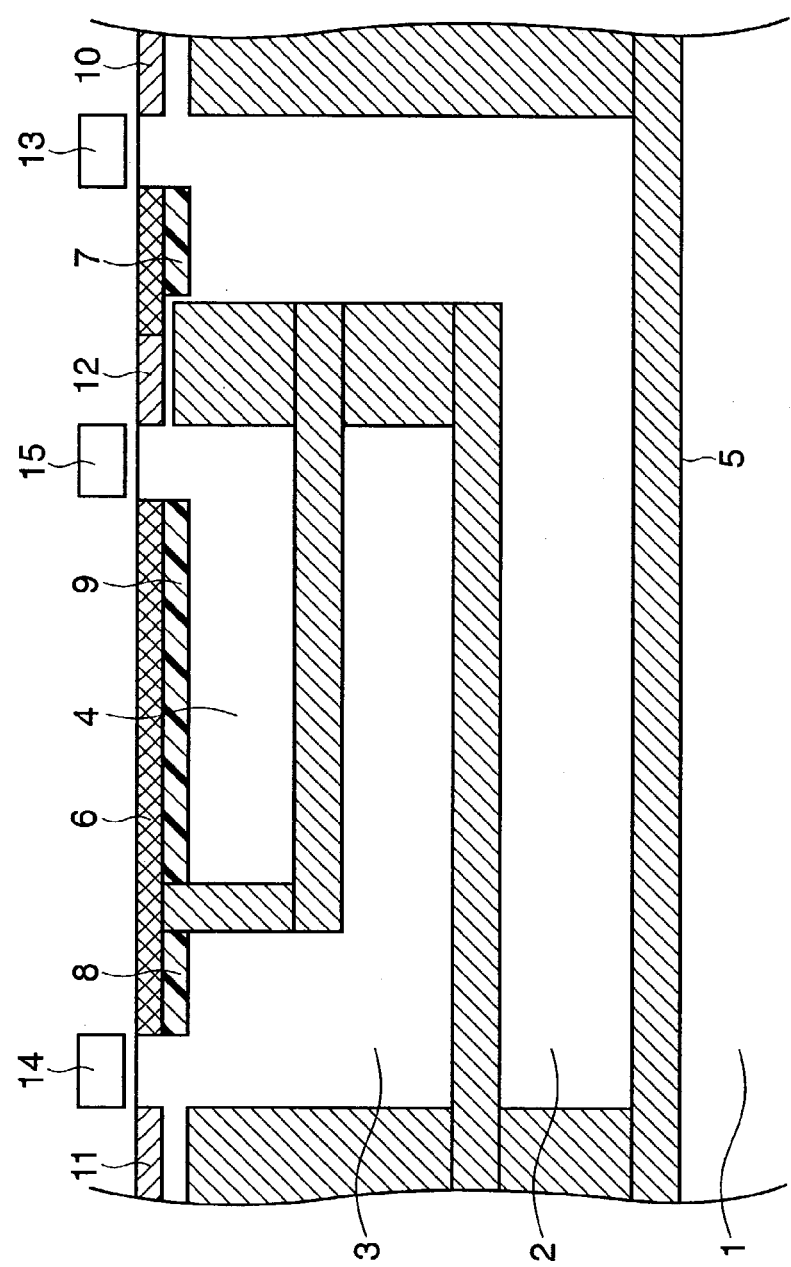
FIG. 1 is a sectional view showing a section of a pixel which has a multi-layered photodiode structure according to a first embodiment of the present invention.

FIG. 1 is a sectional view of a photodiode and signal charge transfer portion of a pixel according to the first embodiment of the present invention. Referring to FIG. 1, reference numeral 1 denotes an n-type semiconductor substrate; 2, a bottom photoelectric conversion portion of an n-type semiconductor layer; 3, a middle photoelectric conversion portion of an n-type semiconductor layer formed above the photoelectric conversion portion 2; 4, a top photoelectric conversion portion of an n-type semiconductor layer formed above the photoelectric conversion portion 3; and 5, a p-type semiconductor layer used to electrically isolate the photoelectric conversion portions 2, 3, and 4. The p-type semiconductor layer 5 and the photoelectric conversion portions 2, 3, and 4 respectively form photodiodes.

Reference numeral 6 denotes a p-type semiconductor layer formed in a semiconductor interface; 7, a signal charge accumulation portion which is used to accumulate signal electrons generating in the photoelectric conversion portion 2 and has a higher impurity concentration than the photoelectric conversion portion 2; 8, a signal charge accumulation portion which is used to accumulate signal electrons generating in the photoelectric conversion portion 3 and has a higher impurity concentration than the photoelectric conversion portion 3; 9, a signal charge accumulation portion which is used to accumulate signal electrons generating in the photoelectric conversion portion 4 and has a higher impurity concentration than the photoelectric conversion portion 4; 10, a floating diffusion (to be abbreviated as "FD" hereinafter) to which a signal charge accumulated on the signal charge accumulation portion 7 is transferred; 11, an FD to which a signal charge accumulated on the signal charge accumulation portion 8 is transferred; 12, an FD to which a signal charge accumulated on the signal charge accumulation portion 9 is transferred; 13, a transfer gate used to transfer a signal charge accumulated on the signal charge accumulation portion 7 to the FD 10; 14, a transfer gate used to transfer a signal charge accumulated on the signal charge accumulation portion 8 to the FD 11; and 15, a transfer gate used to transfer a signal charge accumulated on the signal charge accumulation portion 9 to the FD 12.

Since light components which enter this photodiode structure are converted at different depths depending on their wavelength, the ratio of red, green, and blue components contained in incident light can be calculated by reading out signals of respective photodiodes in one pixel. Furthermore, the respective photoelectric conversion portions and signal charge accumulation portions are fabricated to be depleted after signal charges are transferred to offer noise-free signal charges.

Figure 2:
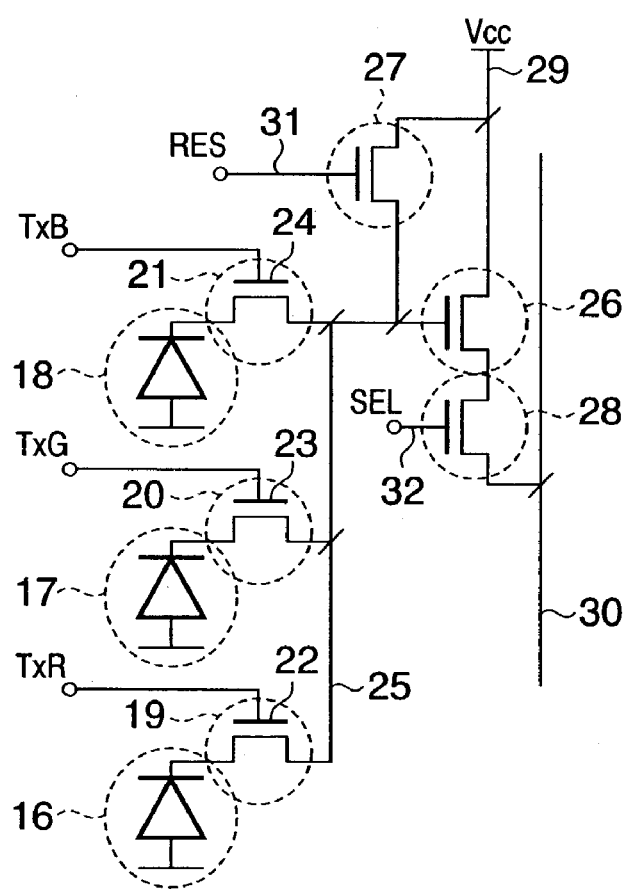
FIG. 2 is an equivalent circuit diagram of the pixel according to the first embodiment of the present invention.

FIG. 2 is an equivalent circuit diagram of the aforementioned pixel. Referring to FIG. 2, reference numeral 16 denotes a photodiode formed in the bottom depth. The anode of this photodiode 16 corresponds to the p-type semiconductor layer 5 in FIG. 1, and its cathode corresponds to the photoelectric conversion portion 2 and signal charge accumulation portion 7 in FIG. 1. Reference numeral 17 denotes a photodiode formed in the middle depth. The anode of this photodiode 17 corresponds to the p-type semiconductor layer 5, and its cathode corresponds to the photoelectric conversion portion 3 and signal charge accumulation portion 8 in FIG. 1. Furthermore, reference numeral 18 denotes a photodiode closest to the surface. The anode of this photodiode 18 corresponds to the p-type semiconductor layer 5, and its cathode corresponds to the photoelectric conversion portion 4 and signal charge accumulation portion 9 in FIG. 1.

Reference numeral 19 denotes a transfer MOS transistor used to transfer a signal charge of the photodiode 16; 20, a transfer MOS transistor used to transfer a signal charge of the photodiode 17; 21, a transfer MOS transistor used to transfer a signal charge of the photodiode 18; and 22, a transfer gate of the transfer MOS transistor 19, which corresponds to the transfer gate 13 in FIG. 1, and receives transfer signal TxR. Reference numeral 23 denotes a transfer gate of the transfer MOS transistor 20, which corresponds to the transfer gate 14 in FIG. 1, and receives transfer signal TxG. Reference numeral 24 denotes a transfer gate of the transfer MOS transistor 21, which corresponds to the transfer gate 15 in FIG. 1, and receives transfer signal TxB. Reference numeral 25 denotes an FD to which signal charges are transferred. The FD 25 is the portion connecting to the FDs 10, 11, and 12 in FIG. 1. Reference numeral 26 denotes an amplification MOS transistor, the gate of which is connected to the FD 25. Reference numeral 27 denotes a reset MOS transistor used to reset the FD 25; 28, a selection MOS transistor used to select an output from the amplification MOS transistor; 29, a line which serves as both a reset power supply and a power supply for the amplification transistor 26; 30, an output line to which the amplified signal is output; and 31, a gate line of the reset MOS transistor 27, which receives reset signal RES. Reference numeral 32 denotes a gate line of the selection MOS transistor 28, which receives select signal SEL.

In a MOS sensor made of pixels of type in which charges are transferred from the photodiodes, as shown in FIG. 2, a noise-free signal from which reset noise of the FD 25 is removed can be read out by taking the difference between a pixel output just after the FD 25 is reset, and a pixel output after a signal charge is transferred to the FD 25. The subtraction operation is performed in a readout circuit which receives a pixel output from the pixel output line 30, and is designed in the vicinity of pixels. Various circuit systems which are used to taking such difference are known to those who are skilled in the art, and a description thereof will be omitted. In the CMOS sensor pixel of signal charge transfer type, as also shown in FIG. 2, the FD, amplifier MOS transistor, reset MOS transistor, and selection MOS transistor can be commonly used for respective photodiodes, and the number of transistors can be reduced.

The operation of the pixel with the arrangement shown in FIG. 2 will be described below with reference to the timing chart in FIG. 3. Assume that all the MOS transistors shown in FIG. 2 are of n-type, and each MOS transistor is on when its gate potential is at High (H) level and is off when its gate potential is Low (L) level. Timing pulses shown in FIG. 3 are the same as those shown in FIG. 2.

Initially, when select signal SEL is changed to H, the source of the amplification MOS transistor 26 is connected to the output line 30 to output the amplified output of the pixel onto the output line 30. At this time, a constant current load is generally connected to the output line 30 to make the amplification transistor 26 operate as a source-follower circuit. When reset signal RES is changed to H, the gate of the amplification MOS transistor 26 is reset by the reset MOS transistor 27, and an amplified output corresponding to a reset level appears on the pixel output line 30. When transfer signal TxR is then changed to H to transfer a signal charge accumulated on the photodiode 16 to the FD 25 via the transfer MOS transistor 19, an output obtained by superposing the signal of the photodiode 16 on the reset output of the pixel appears on the output line 30.

The readout circuit takes the difference between the reset output and the output obtained by superposing the signal on the reset level in the aforementioned operations, thus obtaining a noise-free signal of the photodiode 16. Subsequently, the operation for resetting the FD 25 by setting reset signal RES to H, and the operations for transferring signal charges of the photodiodes 17 and 18 to the FD 25 via the transfer MOS transistors 23 and 24 are performed in turn, thus obtaining noise-free signals of the photodiodes 17 and 18.

Figure 3:
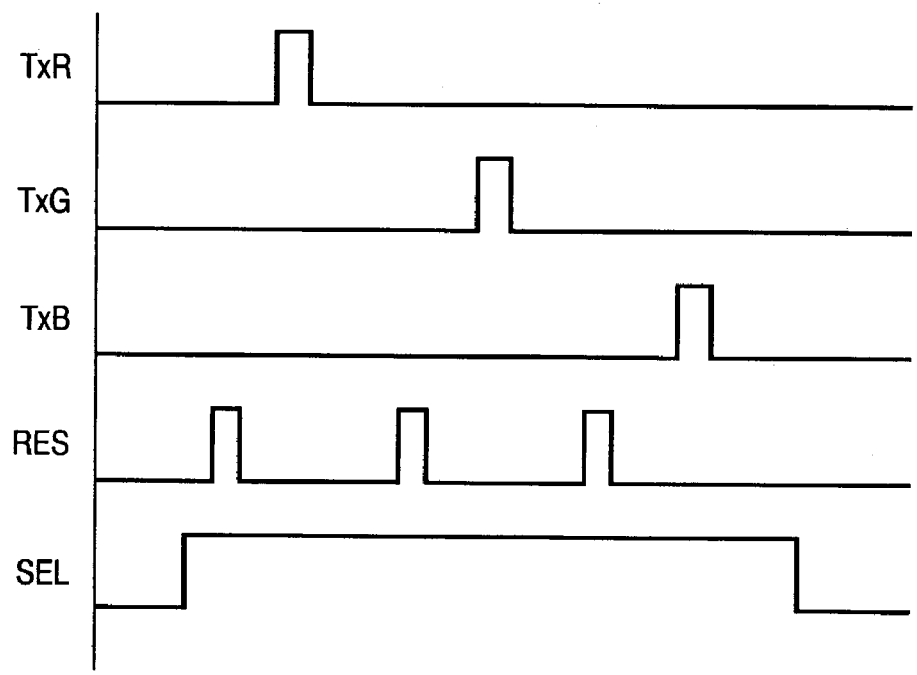
FIG. 3 is a timing chart for explaining the operation of the pixel according to the first embodiment of the present invention.
Figure 4:
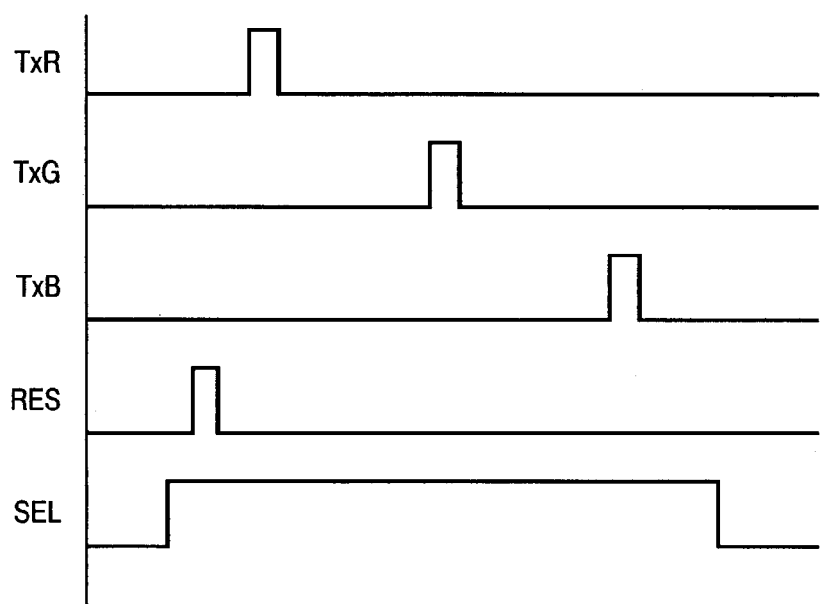
FIG. 4 is a timing chart for explaining the operation of the pixel according to the first embodiment of the present invention.

FIG. 4 is a timing chart showing a pixel operation different from that shown in FIG. 3. In this example, signal charges of the respective photodiodes are sequentially superposed to the FD 25. Let N be the reset level, and S1, S2, and S3 be the signal components of the photodiodes 16, 17, and 18. Then, pixel outputs N, (N+S1), (N+S1+S2), and (N+S1+S2+S3) are time-serially output. By taking their differences in turn, noise-free signals S1, S2, and S3 can be obtained.

As described above, according to the first embodiment of the present invention, in each pixel formed by stacking a plurality of photodiodes in the depth direction, since the respective photodiodes independently amplify and output signal charges, a solid-state image sensing device which can assure high sensitivity and color resolution can be realized. Noise components are reduced by the structure in which the photoelectric conversion portion and signal charge accumulation portion are depleted after signal transfer, and the reduction of the number of transistors afford a sufficient photodiode area.

<Second Embodiment>

Figure 5:
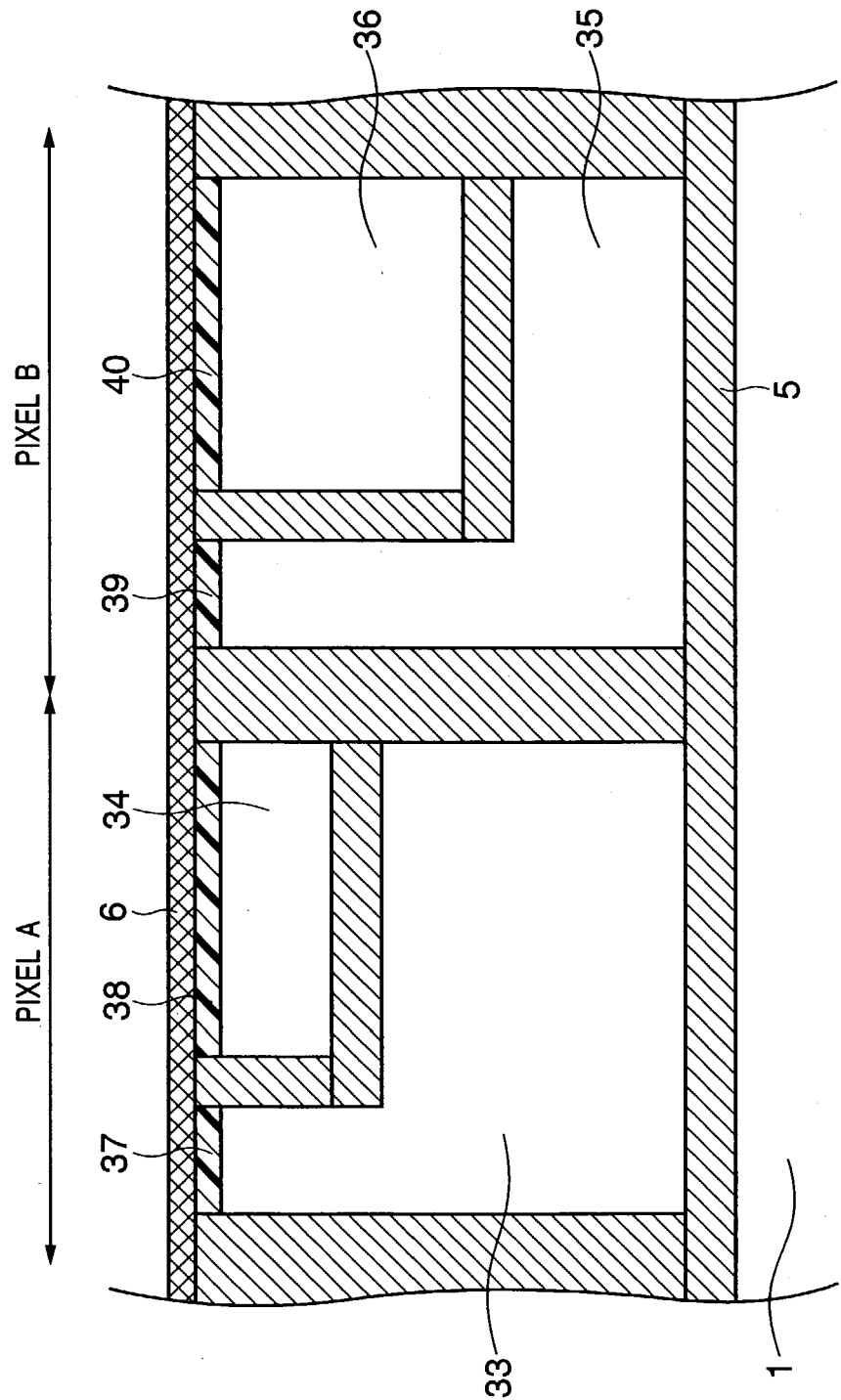
FIG. 5 is a sectional view showing a section of a pixel which has a multi-layered photodiode structure according to a second embodiment of the present invention.

FIG. 5 is a sectional view of two different pixels A and B to explain the second embodiment of the present invention.

The same reference numerals in FIG. 5 denote the same components as those in FIG. 1, and a description thereof will be omitted. Reference numeral 33 denotes a photoelectric conversion portion of an n-type semiconductor layer which is formed in a deeper portion of pixel A; 34, a photoelectric conversion portion of an n-type semiconductor layer which is formed above the photoelectric conversion portion 33 of pixel A; 35, a photoelectric conversion portion of an n-type semiconductor layer which is formed in a deeper portion of pixel B; and 36, a photoelectric conversion portion of an n-type semiconductor layer which is formed above the photoelectric conversion portion 35 of pixel B. Reference numeral 37 denotes a signal charge accumulation portion which is used to accumulate signal electrons generating in the photoelectric conversion portion 33 and has a higher impurity concentration than the photoelectric conversion portion 33; 38, a signal charge accumulation portion which is used to accumulate signal electrons generating in the photoelectric conversion portion 34 and has a higher impurity concentration than the photoelectric conversion portion 34; 39, a signal charge accumulation portion which is used to accumulate signal electrons generating in the photoelectric conversion portion 35 and has a higher impurity concentration than the photoelectric conversion portion 35; and 40, a signal charge accumulation portion which is used to accumulate signal electrons generating in the photoelectric conversion portion 36 and has a higher impurity concentration than the photoelectric conversion portion 36.

In the second embodiment, charge transfer gates corresponding to the signal charge accumulation portions 37, 38, 39, and 40, and FDs for transferring charges are formed as in the first embodiment, but their illustrations are omitted in FIG. 5.

As shown in FIG. 5, the photoelectric conversion portions 33, 34, 35, and 36 have different depths, i.e., have different spectral sensitivity.

Figure 6:
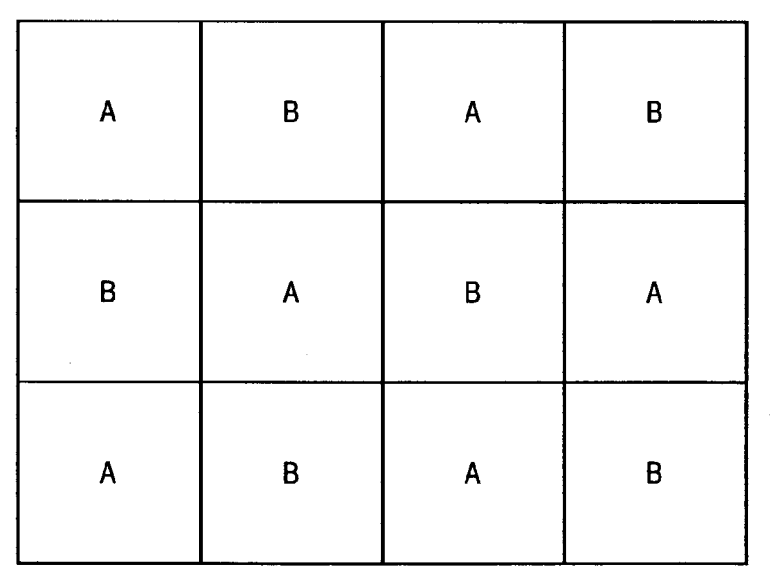

Since the equivalent circuit of each pixel in the second embodiment of the present invention is basically the same as the equivalent circuit in FIG. 2 except that the number of photodiodes is two, the illustration of the circuit is omitted. However, the second embodiment uses two different pixels having different combinations of depths of photodiodes, and FIG. 6 shows an example of a 2D layout of two different pixels A and B. In FIG. 6, pixels A and B are laid out in a checkered pattern.

At least three independent color signals are necessary to reproduce a color image. Hence, the second embodiment, using two different pixels with two different photodiodes as described above, makes it easier to fabricate the photodiodes in the depth direction and to afford greater light-receiving area because of the reduced numbers of transfer MOS transistors and signal charge accumulation portions than the first embodiment.

Note that the combinations of the depths of photodiodes are not limited to the structure shown in FIG. 5, but may be appropriately modified in correspondence with wavelengths of colors, signals of which are to be separately extracted. Hence, the number of types of pixels used is not limited to two, and three or more different pixels having different combinations of depths of photodiodes may be used in design in correspondence with the purpose intended.

<Third Embodiment>

Figure 7:
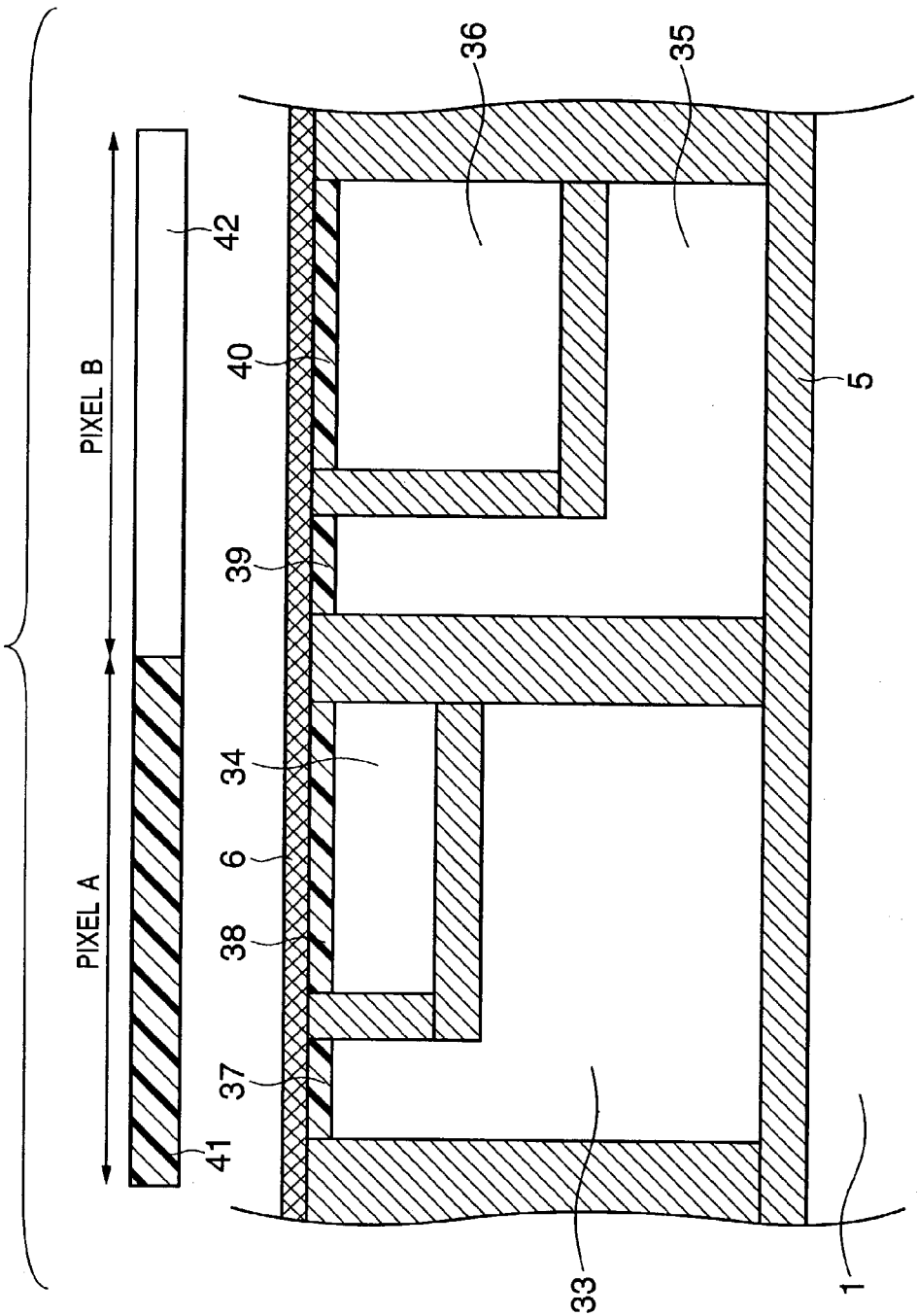
FIG. 7 is a sectional view showing a section of a pixel which has a multi-layered photodiode structure according to a third embodiment of the present invention.

FIG. 7 is a sectional view for explaining the third embodiment of the present invention. Referring to FIG. 7, reference numeral 41 denotes a color filter; and 42, a color filter of type different from the filter 41. The same reference numerals in FIG. 7 denote the same components as those in FIG. 4, and a description thereof will be omitted.

In a sensor which separates color signals by forming plural stages of photodiodes in the depth direction of a semiconductor, the photodiodes of respective depths have different spectral sensitivity. In this case, the output of each photodiode contains signal components generated by red, green, and blue (to be abbreviated as R, G, and B hereinafter) wavelength light, although their ratio varies depending on the depths, and it is difficult to calculate R, G, and B signals from output signals of the respective photodiodes with high reproducibility.

To solve this problem, the third embodiment uses complementary color filters such as cyan, magenta, yellow, and the like on respective pixels. For example, since a cyan filter does not allow any red light to pass through it, blue and green signals can be accurately separated and output when it is combined with pixel A. On the other hand, since a magenta filter does not allow any green light to pass through it, blue and red signals can be accurately separated and output. In this manner, R, G, and B signals can be more accurately obtained from signals of the respective photodiodes.

FIGS. 8A and 8B show examples of combinations of photodiodes of the two-layered structure and color filters, i.e., show layouts each for four pixels in an area sensor. Arbitrary numbers of such layouts are repetitively arranged in the horizontal and vertical directions.

FIG. 8A shows an example in which a pixel that is designed to mainly photoelectrically convert B and G light components (light components within the range from short to middle wavelengths of visible light) at the same time in one pixel (to be referred to as a B/G pixel hereinafter), and a pixel that is designed to mainly photoelectrically convert G and R light components (light components within the range from middle to long wavelengths of visible light) (to be referred to as a G/R pixel hereinafter) are arranged in a checkered pattern. A Cy filter used to cut an R light component is arranged on the surface of each B/G pixel, and an Ye filter used to cut a B light component is arranged on the surface of each G/R pixel. In the layout shown in FIG. 8A, since a G signal serving as a luminance signal can be obtained from every pixel, a prescribed resolution can be maintained.

By combining photodiodes of the two-layered structure and filters in this way, required two-color component signals can be obtained from each pixel. By interpolating the two-color component signals per pixel obtained in this manner by known arithmetic operations, three color signals per pixel can be obtained.

In the example of the structure shown in FIG. 7, pixels A and B have different combinations of depths of photodiodes. However, the present invention is not limited to such specific structure. For example, a plurality of types of color filters may be arranged in combination using photodiodes of a single type. Conversely, three or more different pixels having different combinations of depths of photodiodes may be used in design in correspondence with the purpose intended.

FIG. 8B shows an example in which a photodiode of a single-layered structure, which has a G filter arranged on a pixel and mainly photoelectrically converts a G light component (to be referred to as a G pixel hereinafter), and a photodiode of a two-layered structure, which has a Mg filter arranged on a pixel and is set to mainly photoelectrically convert B and R light components (to be referred to as a B/R pixel hereinafter), are arranged in a checkered pattern. The resolution of the structures shown in FIGS. 1 and 8A is inferior to that of FIG. 8A, an image can be obtained by a simple structure compared to a case wherein photodiodes of a single-layered structure are used.

<Fourth Embodiment>

FIG. 9 is a sectional view showing the fourth embodiment of the present invention. Referring to FIG. 9, reference numeral 43 denotes a photoelectric conversion portion of pixel A; 44, a photoelectric conversion portion of pixel B; 45, a signal charge accumulation portion which is used to accumulate signal electrons generated by the photoelectric conversion portion 43 and has a high impurity concentration than the portion 43; and 46, a signal charge accumulation portion which is used to accumulate signal electrons generated by the photoelectric conversion portion 44 and has a high impurity concentration than the portion 44. The same reference numerals in FIG. 9 denote components common to those in FIG. 7, and a description thereof will be omitted.

In the fourth embodiment, one pixel has one photodiode, and an equivalent circuit of a pixel is the same as that of a typical CMOS sensor. However, the photoelectric conversion portion 43 of pixel A of the fourth embodiment has a structure which extends below the photoelectric conversion portion 44 of the adjacent pixel. A filter of pixel A uses a color such as red, yellow, or the like corresponding to a longer wavelength. On the other hand, as a filter of pixel B uses a color such as blue, cyan, or the like corresponding to a shorter wavelength is used. Most of short-wavelength light are absorbed at a shallow portion of a semiconductor, but much long-wavelength light are absorbed at a deep portion of a semiconductor. If the photodiode of pixel B has the same depth as that of pixel A, some of long-wavelength light that have obliquely entered pixel A generate signal charge components in the deep portion of the photodiode of pixel B. As a result of the signal flow, signal components of pixel A decrease, and cross talk increases.

However, by adopting the photodiode structure shown in FIG. 9, a solid-state image sensing device which can eliminate the aforementioned drawbacks, i.e., can assure higher sensitivity of long-wavelength signal components, and can reduce color crosstalk can be realized.

As described above, according to the fourth embodiment of the present invention, since the photodiode that mainly photoelectrically converts longer-wavelength light extends below the photodiode that mainly converts shorter-wavelength light, high sensitivity of longer-wavelength signal components can be keped and color crosstalk can be reduced compared to a conventional solid-state image sensing device.

<Fifth Embodiment>

An image sensing system which uses the photoelectric conversion element and solid-state image sensing device that have been explained in the first to fourth embodiments will be explained below with reference to FIG. 10.

Referring to FIG. 10, reference numeral 401 denotes a barrier which serves as both a lens protection member and a main switch; 402, a lens which forms an optical image of an object on a solid-state image sensing element 404; 403, an aperture used to variably control the amount of light that has passed through the lens 402; 404, a solid-state image sensing element which captures as an image signal the optical image of the object formed by the lens 402; 405, an image signal processing circuit which includes a variable gain amplifier for amplifying an image signal output from the solid-state image sensing element 404, a gain correction circuit for correcting gain values, and the like; 406, an analog-to-digital (A/D) converter which A/D-converts the image signal output from the solid-state image sensing element 404; 407, a signal processor which makes various correction processes of image data output from the A/D converter 406, and compresses the data; 408, a timing generator which outputs various timing signals to the solid-state image sensing element 404, image signal processing circuit 405, A/D converter 406, and signal processor 407; 409, a camera control/arithmetic unit which makes various arithmetic operations, and controls the entire still video camera; 410, a memory which temporarily stores image data; 411, a recording medium control interface which is used to record/read out data on/from a recording medium; 412, a detachable recording medium such as a semiconductor memory or the like on/from which image data is recorded/read out; and 413, an interface which is used to communicate with an external computer or the like.

Figure 11:
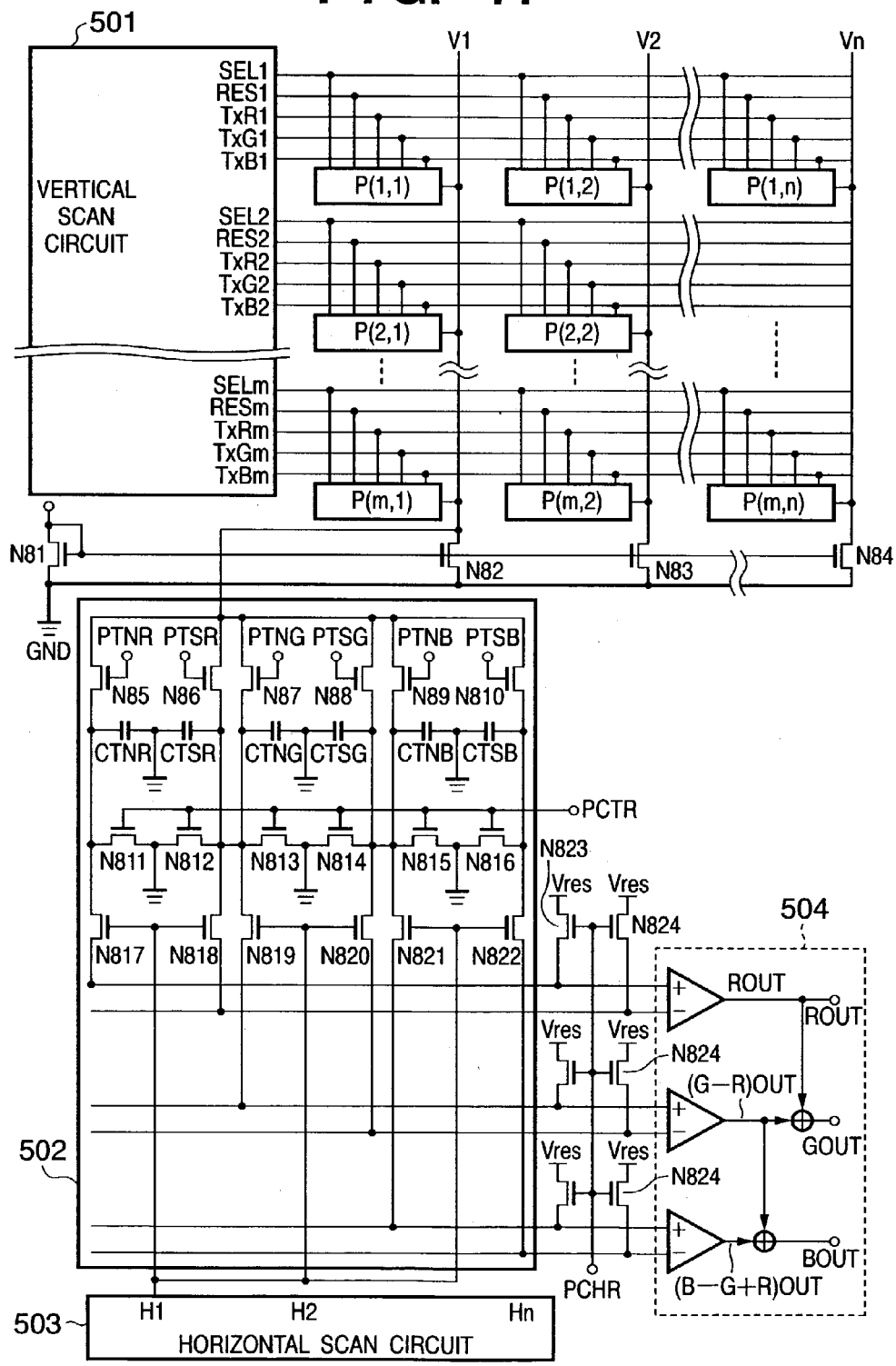
FIG. 11 is a circuit diagram showing an example of the detailed arrangement of a solid-state image sensing element shown in FIG. 10.
Figure 12:
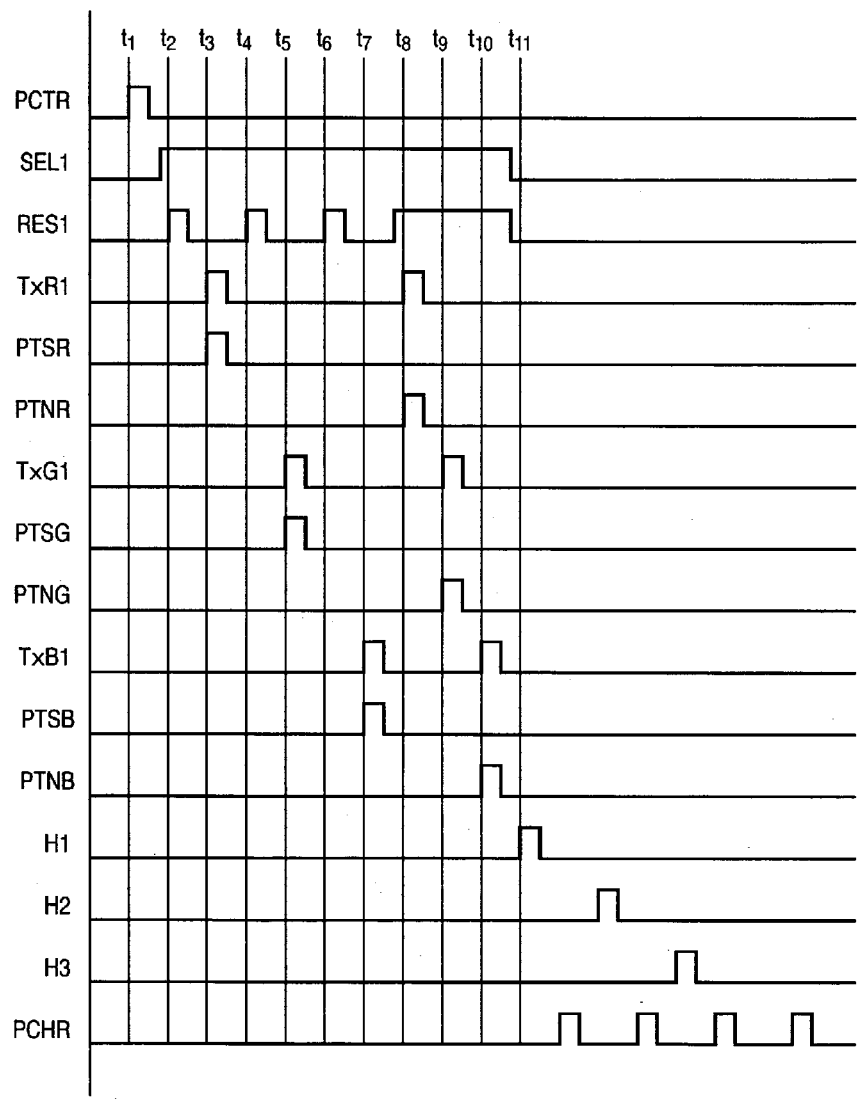
FIG. 12 is a timing chart for driving the solid-state image sensing element shown in FIG. 11.
Figure 13:
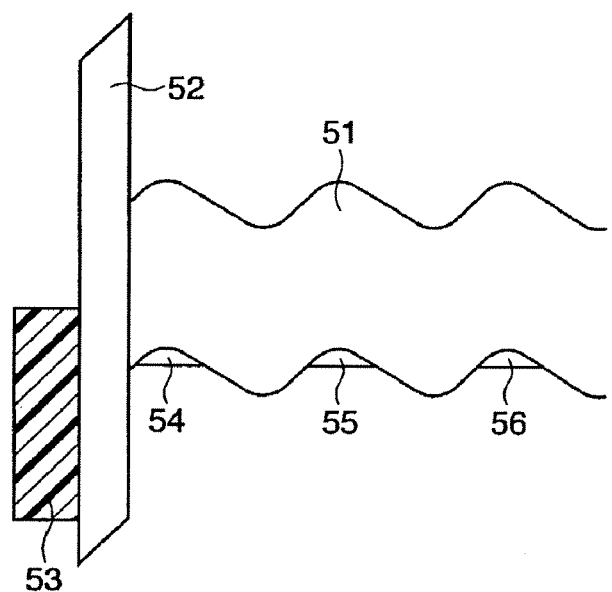
FIG. 13 is a potential diagram of a conventional photodiode of the three-layered structure.
Figure 14:
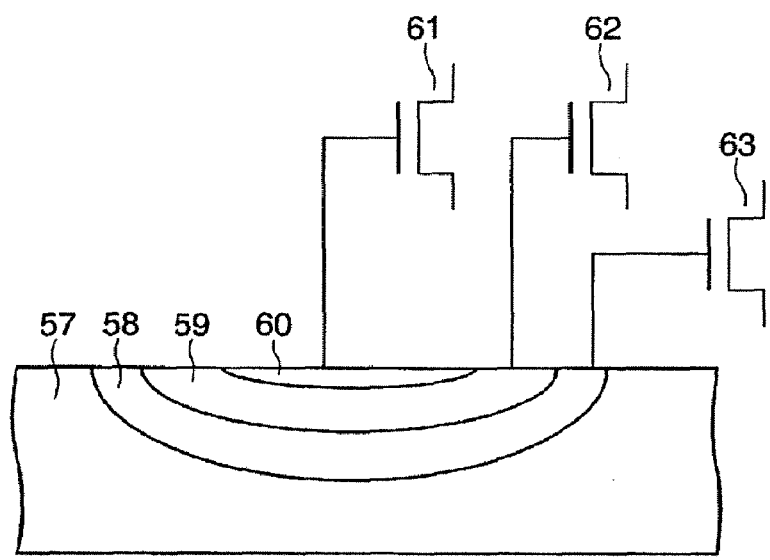
FIG. 14 is a sectional view showing a section of the conventional photodiode of the three-layered structure.

FIG. 11 shows the detailed arrangement of the solid-state image sensing element 404. Each pixel may have any of the structures explained in the first to fourth embodiments. However, assume that each pixel has the structure shown in FIG. 1 in this embodiment. The arrangement and operation of FIG. 11 will be explained below with reference to the timing chart shown in FIG. 12.

Reference numeral 501 denotes a vertical scan circuit which selects a row that transfers charges accumulated on pixels; and 502, a holding circuit which temporarily holds signal charges and noise charges transferred from respective pixels for respective colors. FIG. 11 illustrates only one holding circuit 502, but a plurality of holding circuits 502 are arranged in correspondence with respective columns in practice. Reference numeral 503 denotes a horizontal scan circuit which sequentially transfers charges accumulated on the holding circuit 502 to a signal output unit 504. The signal output unit 504 processes the transferred charges, and outputs respective color signals.

As the operation of the solid-state image sensing element 404, a case will be explained below wherein a charge is read out from a pixel P(1, 1).

After exposure of the solid-state image sensing element 404 for a predetermined period of time, signal PCTR is changed to High (H) at t1 to reset capacitances CTNR, CTSR, CTNG, CTSG, CTNB, and CTSB in the holding circuit 502. Slightly before t2, select signal SEL1 is changed to H to select the first row. Reset signal RES1 is changed to H at t2 to reset the FD 25. At t3, signals TxR1 and PTSR are changed to H to transfer a charge obtained by the photodiode 16 to the capacitance CTSR. Subsequently, reset signal RES1 is changed at t4 to H again to reset the FD 25. After that, signals TxG1 and PTSG are changed to H at t5 to transfer a charge obtained by the photodiode 17 to the capacitance CTSG. Likewise, reset signal RES1 is changed at t6 to H again to reset the FD 25. After that, signals TxB1 and PTSB are changed to H at t7 to transfer a charge obtained by the photodiode 18 to the capacitance CTSB.

Slightly before t8, signal RES1 is changed to H again. Then, signals TxR1 and PTRN (t8), TxG1 and PTNG (t9), and TxB1 and PTNB (t10) are changed to H in turn while signal RES1 is held at H, thereby respectively reading out noise components to the capacitances CTNR, CTNG, and CTNB.

At t11, signal H1 is changed to H to transfer charges on the capacitances CTSR, CTNR, CTSG, CTNG, CTSB, and CTNB to corresponding differential amplifiers of the signal output unit 504, thereby subtracting the charges of noise components from those accumulated upon exposure and outputting difference signals.

After that, signals H2 to Hn are changed to H in turn, and signal PCHR is changed to H during the H periods of these signals, thus sequentially transferring charges for one row to the differential amplifiers and outputting differences while resetting lines to the signal output unit 504 to a predetermined potential. By repeating operations after t1 in correspondence with the number of rows, an image signal for one frame can be read out.

The operation of the still video camera upon image sensing in the above arrangement will be explained below.

When the barrier 401 is opened, a main power supply is turned on, a power supply for a control system is then turned on, and a power supply for image sensing system circuits including the A/D converter 406 and the like is then turned on.

After that, in order to control an exposure value, the camera control/arithmetic unit 409 fully opens the aperture 403, and a signal output from the solid-state image sensing element 404 is converted by the A/D converter 406 and is then input to the signal processor 407. The camera control/arithmetic unit 409 makes photometry on the basis of data which has undergone a predetermined signal process by the signal processor 407, determines brightness based on the photometry result, and calculates an exposure value. Then, the unit 409 controls the aperture 403 in accordance with the obtained exposure value.

The camera control/arithmetic unit 409 then calculates the distance to an object by extracting high-frequency components on the basis of the signal output from the solid-state image sensing element 404. The unit 409 drives the lens to see if an in-focus state is attained. If it is determined that an in-focus state is not attained, the unit 409 drives the lens again to measure the distance. After an in-focus state is confirmed, the unit 409 starts main exposure.

Upon completion of exposure, an image signal output from the solid-state image sensing element 404 is A/D-converted by the A/D converter 406, and digital image data is written in the memory 410 via the signal processor 407 under the control of the camera control/arithmetic unit 409.

After that, the data stored in the memory 410 is recorded on the detachable recording medium 412 such as a semiconductor memory or the like via the recording medium control I/F 411 under the control of the camera control/arithmetic unit 409.

Note that image data may be directly input to a computer or the like via the external I/F 413 to process an image.

Note that the solid-state image sensing element using the photodiodes of a multi-layered structure can also be applied to any other image sensing devices using area sensors in addition to the still video camera. Again, when the photodiodes may be arranged linearly to form a line sensor, they can be applied to image reading devices such as a scanner, facsimile, and the like. As can be understood by those who are skilled in the art, the present invention can be widely applied to various known devices using solid-state image sensing elements in addition to the above devices.

As described above, according to the present invention, upon reading out signals from a plurality of photodiode layers, highly color-separable signals, which suffer less color mixture and noise, can be read out.

As many apparently widely different embodiments of the present invention can be made without departing from the spirit and scope thereof, it is to be understood that the invention is not limited to the specific embodiments thereof except as defined in the appended claims.

What is claimed is:

1. A photoelectric conversion element which is formed by alternately stacking first type regions of a first conductivity type and second type regions of a second conductivity type having a conductivity type opposite to the first conductivity type to form a multi-layered structure, in which the first type regions are formed to have depths suited to photoelectrically convert light in a plurality of different wavelength ranges, and which outputs signals for respective wavelength ranges, wherein the plurality of first type regions reach a surface, said photoelectric conversion element comprising:

a plurality of charge accumulation portions of the first conductivity type, each of which is formed in a surface region of the first type region and has a higher impurity concentration than each first type region, for accumulating charges generated by photoelectric conversion in the first type regions;

an output portion for converting charges transferred from the charge accumulation portions into electrical signals, and outputting the electrical signals, said output portion including an amplifier; and transfer gates for transferring charges respectively from the plurality of charge accumulation portions to said output portion.

2. The element according to claim 1, wherein after signal charges are transferred from the charge accumulation portions, the photoelectric conversion regions and the charge accumulation portions are depleted.

3. A solid-state image sensing device comprising an array of a plurality of photoelectric conversion elements, at least some of which have a structure of a photoelectric conversion element of claim 1.

4. A solid-state image sensing device comprising an array formed of a plurality of first and second photoelectric conversion elements, which have a structure of a photoelectric conversion element of claim 1 and output signals in a plurality of different wavelength ranges, wherein each first photoelectric conversion element photoelectrically converts light in first and second wavelength ranges, and each second photoelectric conversion element photoelectrically converts light in third and fourth wavelength ranges.

5. The device according to claim 4, wherein each first photoelectric conversion element has a filter for intercepting light other than light in the first and second wavelength ranges, and each second photoelectric conversion element has a filter for intercepting light other than light in the third and fourth wavelength ranges.

6. A solid-state image sensing device comprising an array formed of:

a plurality of first photoelectric conversion elements, each of which photoelectrically converts light in a first wavelength range, and has a filter for intercepting light other than the light in the first wavelength range;

and a plurality of second photoelectric conversion elements, each of which has a structure of a photoelectric conversion element of claim 1, photoelectrically converts light in second and third wavelength ranges, and has a filter for intercepting the light in the first wavelength range.

7. The device according to claim 4, wherein after signal charges are transferred from the charge accumulation portions, the photoelectric conversion regions and the charge accumulation portions of the first and second photoelectric conversion elements are depleted.

8. An image sensing apparatus having a solid-state image sensing device of claim 3.

9. An image reading apparatus having a solid-state image sensing device of claim 3.

10. A photoelectric conversion element which is formed by alternately stacking first type regions of a first conductivity type and second type regions of a second conductivity type having a conductivity type opposite to the first conductivity type to form a multi-layered structure, in which the first type regions are formed to have depths suited to photoelectrically convert light in a plurality of different wavelength ranges, and which outputs signals for respective wavelength ranges, wherein the plurality of first type regions reach a surface, said photoelectric conversion element comprising:

a plurality of charge accumulation portions of the first conductivity type, each of which is formed in a surface region of the first type region and has a higher impurity concentration than each first type region, for accumulating charges generated by photoelectric conversion in the first type regions;

floating diffusion regions; and transfer gates for transferring charges from the plurality of charge accumulation portions to said floating diffusion regions, respectively, wherein each of said floating diffusion regions is formed in a surface region of each of the second type regions.

11. The element according to claim 10, wherein said floating diffusion regions are connected to each other.

12. A photoelectric conversion element which is formed by alternately stacking first type regions of a first conductivity type and second type regions of a second conductivity type having a conductivity type opposite to the first conductivity type to form a multi-layered structure, in which the first type regions are formed to have depths suited to photoelectrically convert light in a plurality of different wavelength ranges, and which outputs signals for respective wavelength ranges, wherein the plurality of first type regions reach a surface, said photoelectric conversion element comprising:

a plurality of charge accumulation portions of the first conductivity type, each of which is formed in a surface region of the first type region and has a higher impurity concentration than each first type region, for accumulating charges generated by photoelectric conversion in the first type regions;

output portions for converting charges transferred from the charge accumulation portions into electrical signals, and outputting the electrical signals; and transfer gates for transferring charges from the plurality of charge accumulation portions to said output portions, respectively, wherein channels of the transfer gates are formed in the first type regions.

13. The element according to claim 12, wherein a part of each of the output portions is connected to each other and commonly used by the charge accumulation portions.

* * * * *